(12) United States Patent
Liaw

(10) Patent No.: US 7,505,354 B2
(45) Date of Patent: Mar. 17, 2009

(54) WORD LINE VOLTAGE CONTROL CIRCUIT FOR MEMORY DEVICES

(75) Inventor: Jhon-Jhy Liaw, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 159 days.

(21) Appl. No.: 11/502,016

(22) Filed: Aug. 10, 2006

(65) Prior Publication Data

US 2008/0037354 A1    Feb. 14, 2008

(51) Int. Cl.
*G11C 8/00*    (2006.01)
(52) U.S. Cl. .............................. 365/230.06; 365/189.11; 365/229
(58) Field of Classification Search .................. 365/242
See application file for complete search history.

(56) References Cited

U.S. PATENT DOCUMENTS 6,188,628 B1 *    2/2001    Tomotani ................... 365/226

7,274,618 B2 *    9/2007    Leung ................... 365/230.06

FOREIGN PATENT DOCUMENTS

JP    2006-252718    *    9/2006

* cited by examiner

*Primary Examiner*—Tan T. Nguyen
(74) *Attorney, Agent, or Firm*—Kirkpatrick & Lockhart Preston Gates Ellis LLP

(57) ABSTRACT

A memory device includes at least one memory array having a plurality of memory cells addressed by a plurality of word lines and bit lines, and coupled between a power line and a ground line. A word line decoder is coupled to one end of the word line for selecting the word lines in response to input signals. A voltage control circuit is coupled to another end of the word line for connecting the word line to a ground voltage when the memory device is in a sleep mode, wherein the voltage control circuit is supplied by DC power.

17 Claims, 10 Drawing Sheets

WORD LINE VOLTAGE CONTROL CIRCUIT FOR MEMORY DEVICES

BACKGROUND

The present invention relates generally to integrated circuit (IC) designs, and more particularly to a word line voltage control circuit for memory devices.

Performance requirements for microprocessors, portable devices, and wireless devices have increased significantly over the last few decades. Device sizes have been shrinking continuously in order to meet the heightened performance requirements. As a result, a large number of logic circuits and memory cells are packed in a relatively small memory chip. Low power design becomes very important for the memory chip to reduce power consumption and remain thermally stable.

Various circuits and methods have been developed to reduce current leakage for memory devices, such as static random access memory (SRAM) and dynamic random access memory (DRAM), during a stand-by or sleep mode. One method uses a well bias to reduce sub-threshold leakage in a standby mode. In another method, a lower supply voltage is used to reduce junction leakage, sub-threshold leakage and gate leakage. In yet another method, the voltage at a power supply node of a memory device is reduced to the lowest possible level during a sleep mode, such that the data can be retained in memory cells, while the peripheral logic circuits are completely turned off. This is typically called a full-sleep-mode design.

In a full-sleep-mode design, the power consumption of the sleep mode is reduced below than that of the standby mode. In some cases, the power consumption of the sleep mode can be reduced to below one tenth of the standby mode power consumption. It is anticipated that the full-sleep-mode design will become more popular in reducing power consumption of memory devices.

Conventionally, the full-sleep-mode design requires an additional AC (alternating current) voltage control circuit connected to word lines of a memory device. In the normal operation mode, a decoder is enabled to control the word lines, while the AC voltage control circuit is disabled. In the sleep mode, the decoder is disabled and the AC voltage control circuit generates a signal to pull the word lines to either ground voltage or VSS.

Since the conventional voltage control circuit is connected to AC power, it is complex in design. Accordingly, there is a need for a word line voltage control circuit that can achieve the functions of the AC voltage control circuit while being simpler in design.

SUMMARY

The present invention discloses a memory device. In one embodiment of the present invention, the memory device includes at least one memory array having a plurality of memory cells addressed by a plurality of word lines and bit lines, and coupled between a power line and a ground line. A word line decoder is coupled to one end of the word line for selecting the word lines in response to input signals. A voltage control circuit is coupled to another end of the word line for coupling the word line to a ground voltage when the memory device is in a sleep mode, wherein the voltage control circuit is supplied by DC power.

The construction and method of operation of the invention, however, together with additional objectives and advantages thereof will be best understood from the following description of specific embodiments when read in connection with the accompanying drawings.

DESCRIPTION

Figure 1:
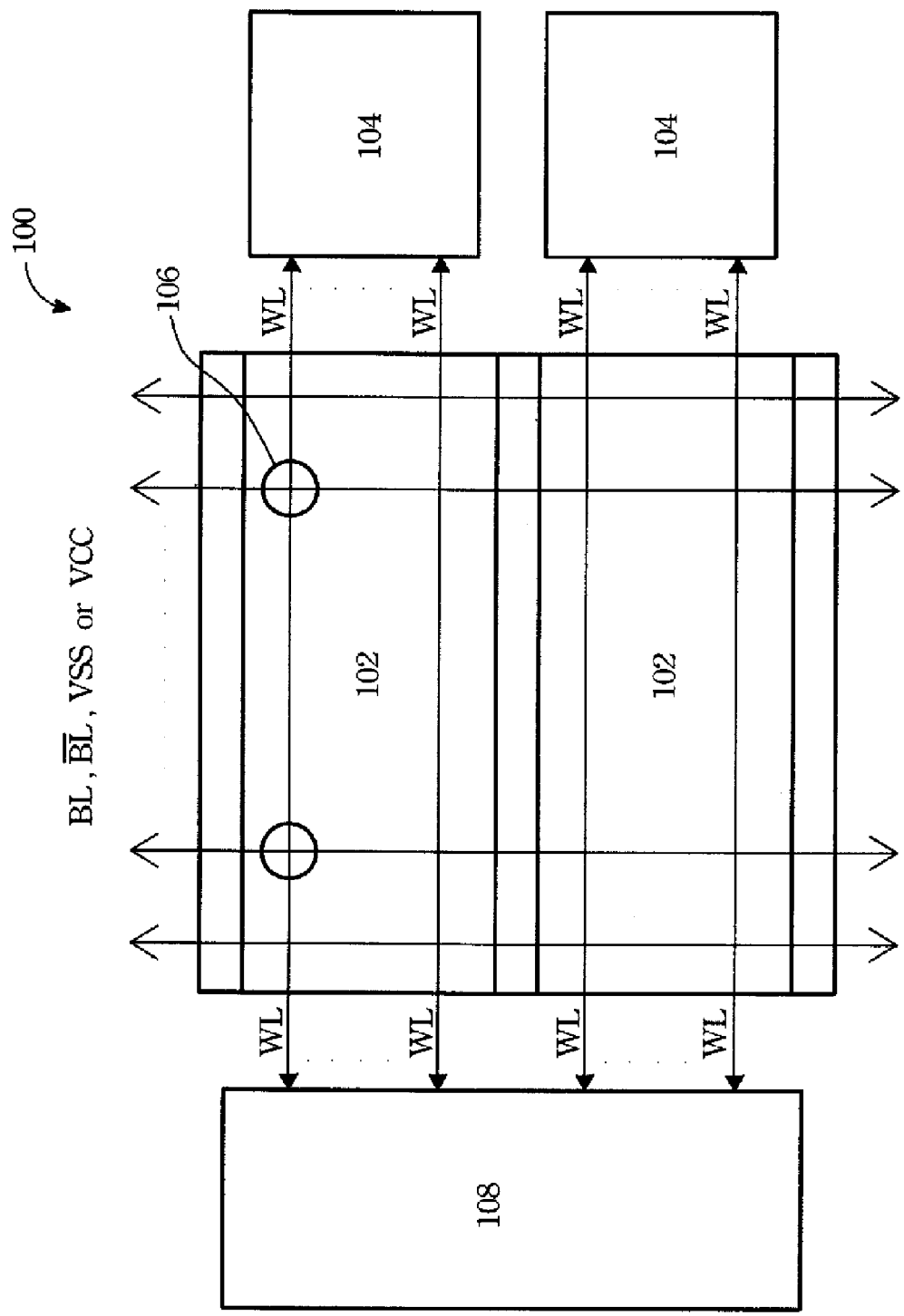
FIG. 1 illustrates a block diagram of a conventional voltage control circuit controlling word lines of an SRAM array.

FIG. 1 illustrates a block diagram 100 of a conventional AC voltage control circuit 108 controlling word lines WL of an SRAM array 102. The SRAM array 102 has a plurality of memory cells 106 at the intersections of each word lines WL and bit lines BL. Each memory cell 106 is also connected to a power supply line denoted by VCC and a ground line denoted by VSS. The word lines WL control pass gate devices of the memory cells 106. The word line WL has two terminals, one being connected to the word line decoder 104 and another being connected to the AC voltage control circuit 108. In a normal operation mode, the word line decoder 104 is active and the AC voltage control circuit 108 is disabled. In a sleep mode, the word line decoder 104 is inactive and the AC voltage control circuit 108 is enabled to generate VDD, which is a voltage lower than VCC, to the word lines WL.

One drawback of the conventional AC voltage control circuit 108 is its complexity in design. Depending on the mode of the SRAM array 102, a signal is specifically generated to control the AC voltage control circuit 108. Moreover, the AC voltage control circuit 108 requires certain control loading designs because of its AC nature.

Figure 2:
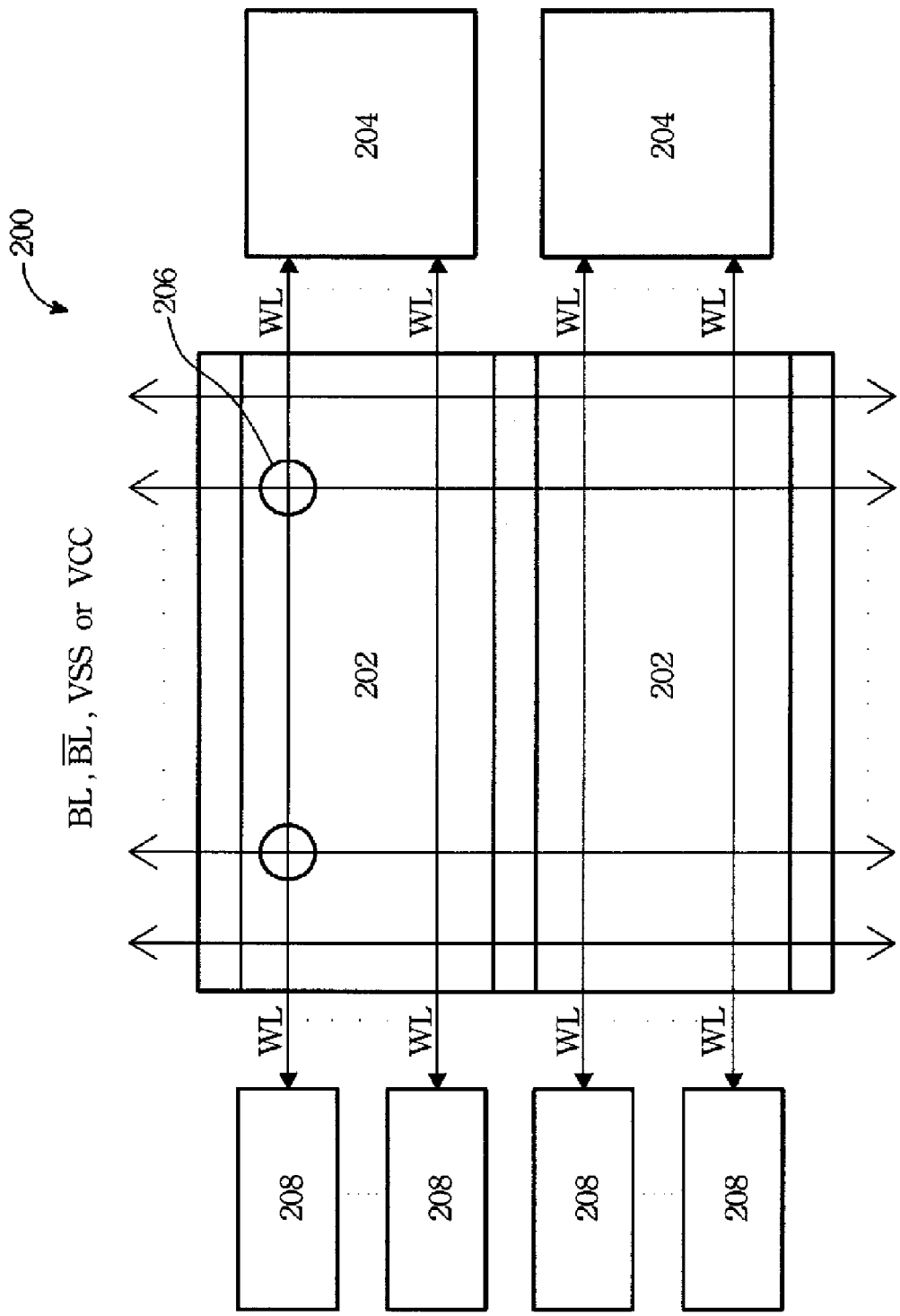
FIG. 2 illustrates a block diagram of a voltage control circuit controlling word lines of an SRAM array in accordance with one embodiment of the present invention.

FIG. 2 schematically illustrates a block diagram 200 of a DC voltage control circuits 208 controlling word lines WL of an SRAM array 202 in accordance with one embodiment of the present invention. It is noted that while the embodiment uses an SRAM array as an example for illustration, the basic principles of the invention can be applied to other memory devices, such as DRAM devices.

The SRAM array 202 has a plurality of memory cells 206, such as six-transistor cells or eight-transistor cells, at intersections of word lines WL and bit lines BL. Each memory cell 206 is also coupled to a power supply line denoted by VCC and a ground line denoted by VSS. The word line WL controls pass gate devices of the memory cells 206. The word line WL has two terminals, one being coupled to a word line decoder 204 and another being coupled to the DC voltage control circuit 208, which is further connected to a ground voltage and a predetermined voltage, such as VDD.

During a read or write operation, the DC voltage control circuit 208 is disabled and the SRAM decoder 204 decodes the address of its inputs, and selects one or more word lines WL. During a sleep or standby mode, the supply power VCC is lowered to VDD, which is a minimum voltage threshold that will maintain the data stored in the memory cells 206. The logical circuits including the SRAM decoder 204 are disabled or turned off. The DC voltage control circuit 208 couples the word lines to ground to turn off the pass gate devices in the memory cells 206, thereby preventing leakage current.

The DC voltage control circuit 208 is controlled by the voltage on the word line. When the voltage on the word line WL is high, the DC voltage control circuit 208 is turned off. When the decoder 204 is disabled, the word line WL is floating and the DC voltage control circuit 208 is switched on to pull the world line WL to ground. Thus, no extra signal is needed to control the DC voltage control circuit 208. Furthermore, since the voltage control circuit 208 is powered by DC, its design is simpler than that of the conventional AC voltage control circuit.

Six different embodiments of the DC voltage control circuit are proposed and illustrated in the following paragraphs. Each of the DC voltage control circuits perform the same functions as explained above. As such, their operations will not be discussed in detail in order to avoid repetition.

Figure 3:
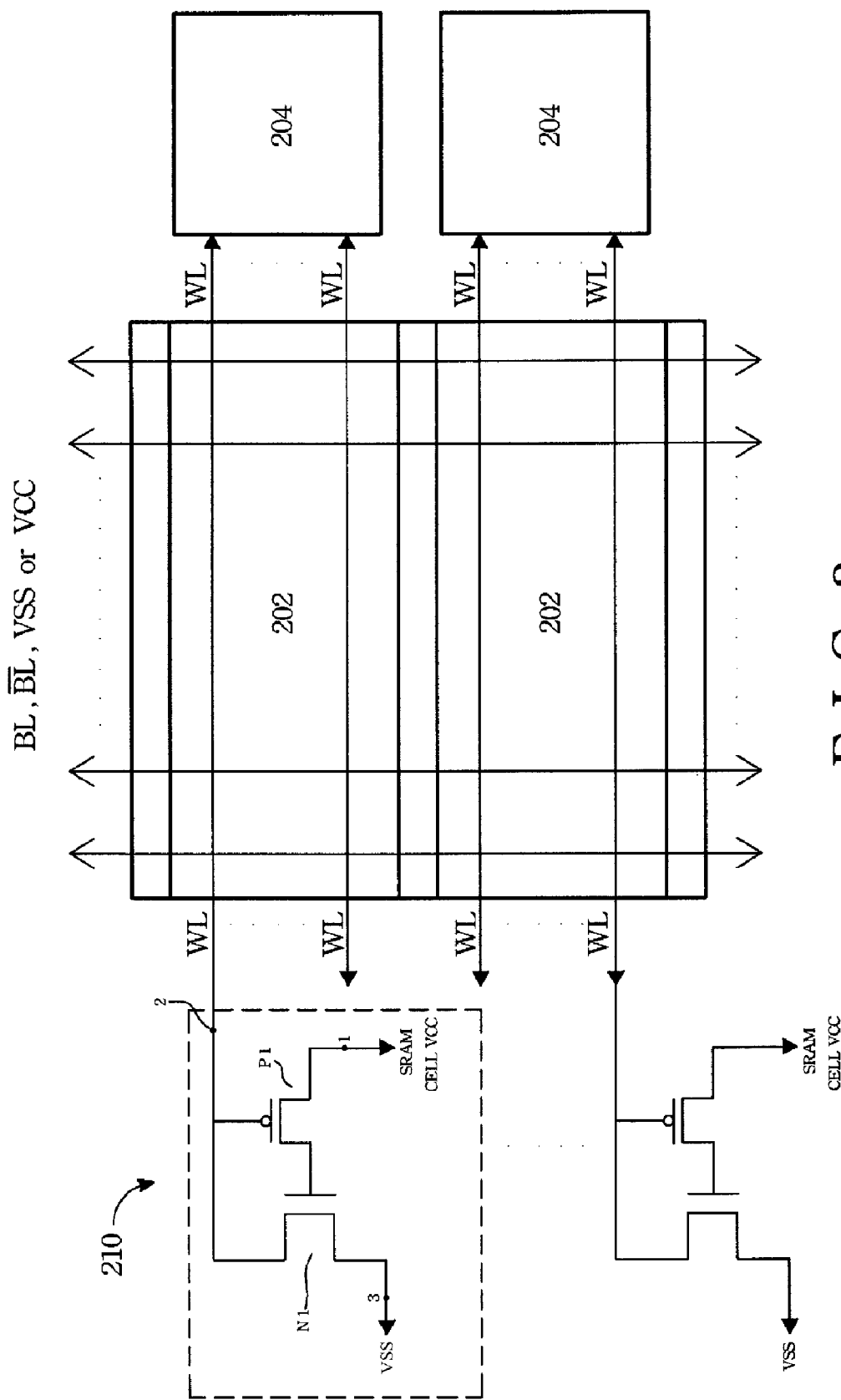
FIG. 3 schematically illustrates the voltage control circuit in accordance with the first embodiment of the present invention.

FIG. 3 schematically illustrates a DC voltage control circuit 210 in accordance with the first embodiment of the present invention. The DC voltage control circuit 210 is comprised of one NMOS transistor N1 and one PMOS transistor P1. The source of the PMOS transistor P1 is coupled to a supply voltage VCC. The gate of the PMOS transistor P1 and the drain of the NMOS transistor N1 are coupled together with the word line WL, which is further coupled to the decoder 204. The source of the NMOS transistor N1 is coupled to either ground or VSS. The drain of the PMOS transistor P1 is coupled to the gate of the NMOS transistor N1.

Figure 4:
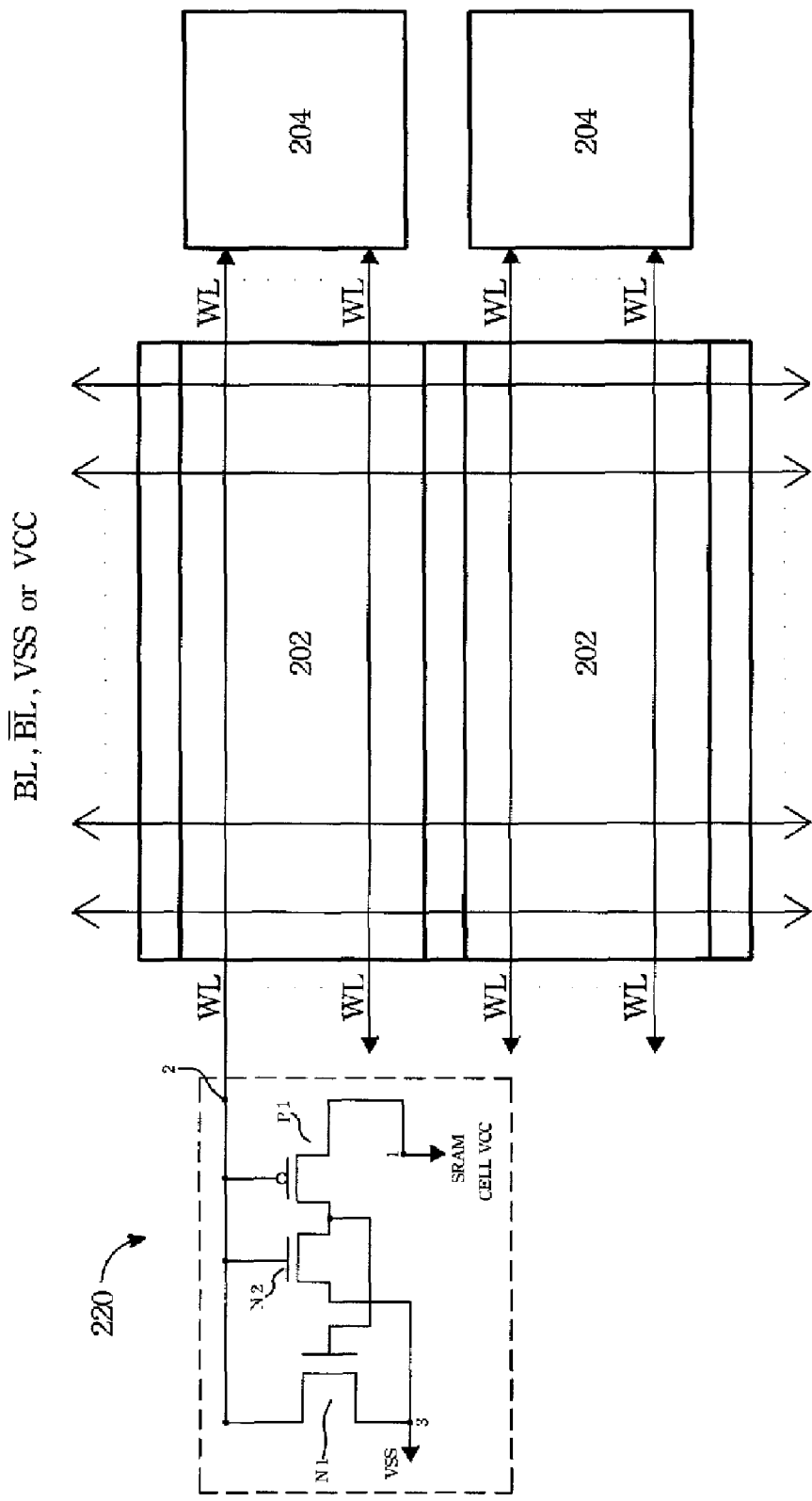
FIG. 4 schematically illustrates the voltage control circuit in accordance with the second embodiment of the present invention.

FIG. 4 schematically illustrates a DC voltage control circuit 220 in accordance with the second embodiment of the present invention. The DC voltage control circuit 220 includes two NMOS transistors N1, N2 and one PMOS transistor P1. The source of the PMOS transistor P1 is coupled to a supply voltage VCC. The gate of the PMOS transistor P1, the gate of the NMOS transistor N2 and the drain of the NMOS transistor N1 are coupled together with the word line WL, which is further coupled to the decoder 204. The sources of the NMOS transistor N1 and the NMOS transistor N2 are coupled to either ground or VSS. The drain of the PMOS transistor P1 is coupled to the gate of the NMOS transistor N1 and the drain of the NMOS transistor N2.

Figure 5:
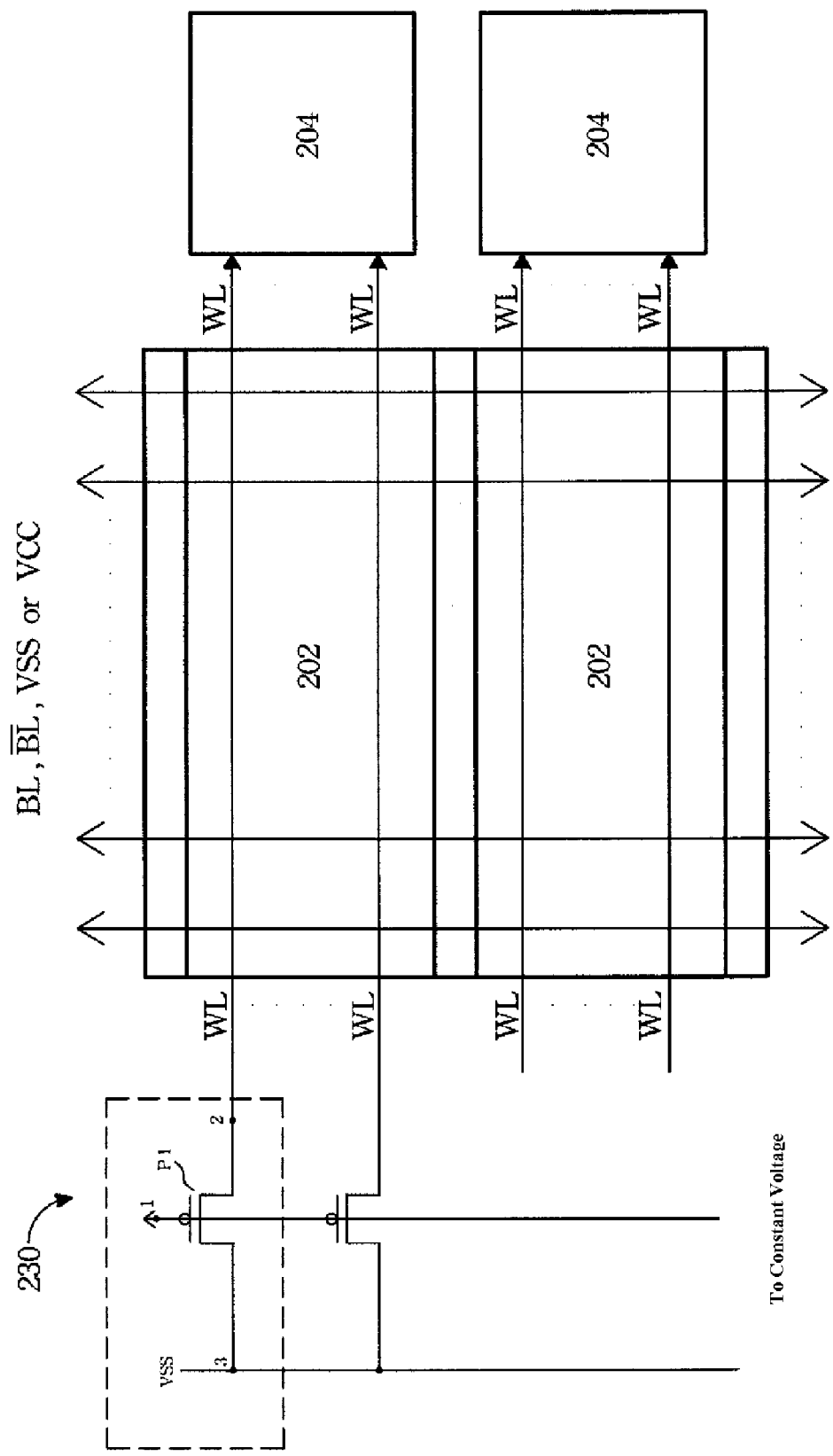
FIG. 5 schematically illustrates the voltage control circuit in accordance with the third embodiment of the present invention.

FIG. 5 schematically illustrates a DC voltage control circuit 230 in accordance with the third embodiment of the present invention. The DC voltage control circuit 230 includes at least one PMOS transistor P1 having a gate coupled to a predetermined constant DC voltage, a drain connected to the word line WL and a source coupled to ground or VSS. The N-well of the PMOS transistor P1 is connected to VDD.

Figure 6:
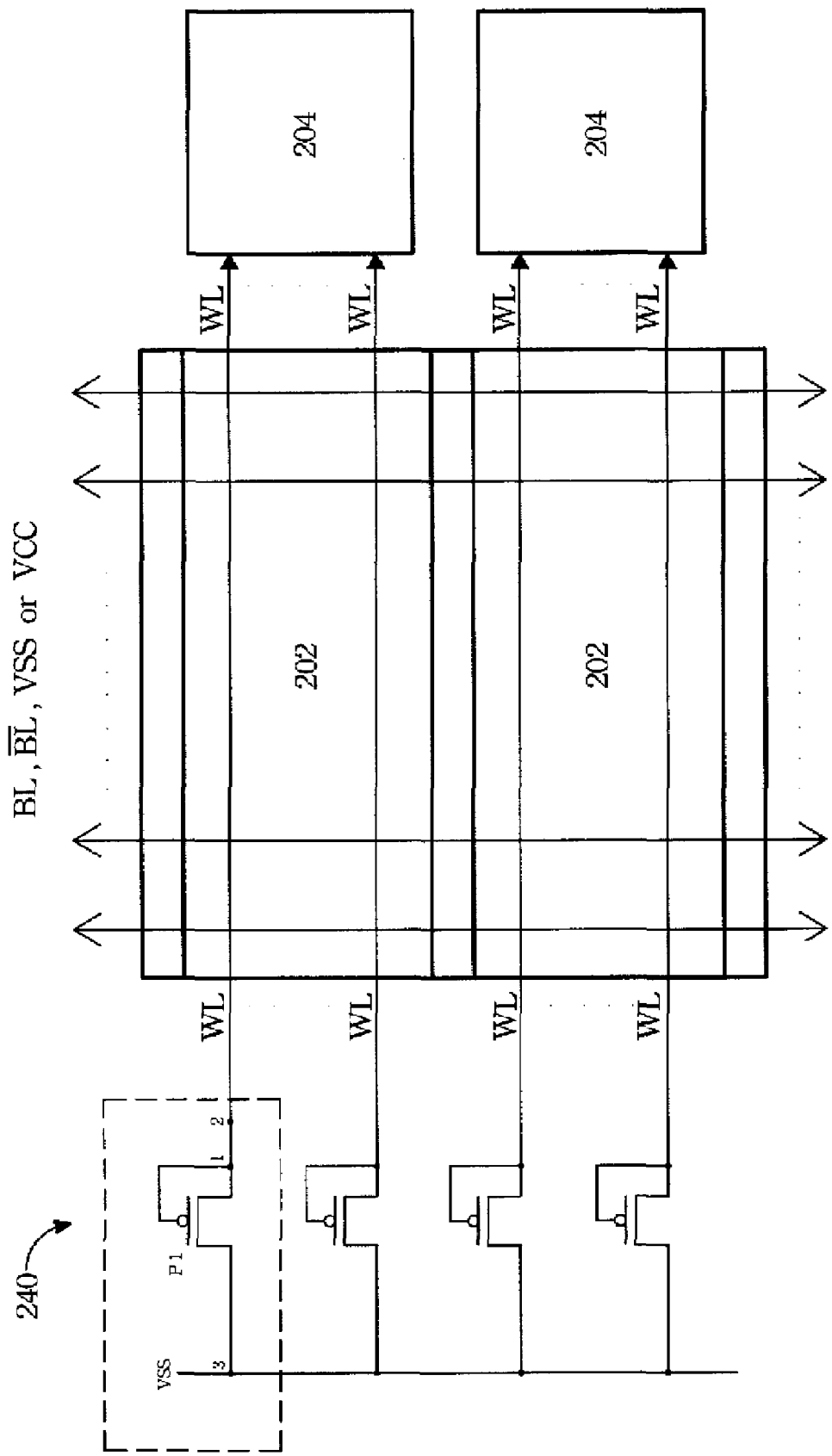
FIG. 6 schematically illustrates the voltage control circuit in accordance with the fourth embodiment of the present invention.

FIG. 6 schematically illustrates a DC voltage control circuit 240 in accordance with the fourth embodiment of the present invention. The DC voltage control circuit 240 includes at least one PMOS transistor P1 having both a gate and a drain coupled to the word line WL, and a source coupled to either ground or VSS. The N-well of the PMOS transistor P1 is coupled to VDD.

Figure 7:
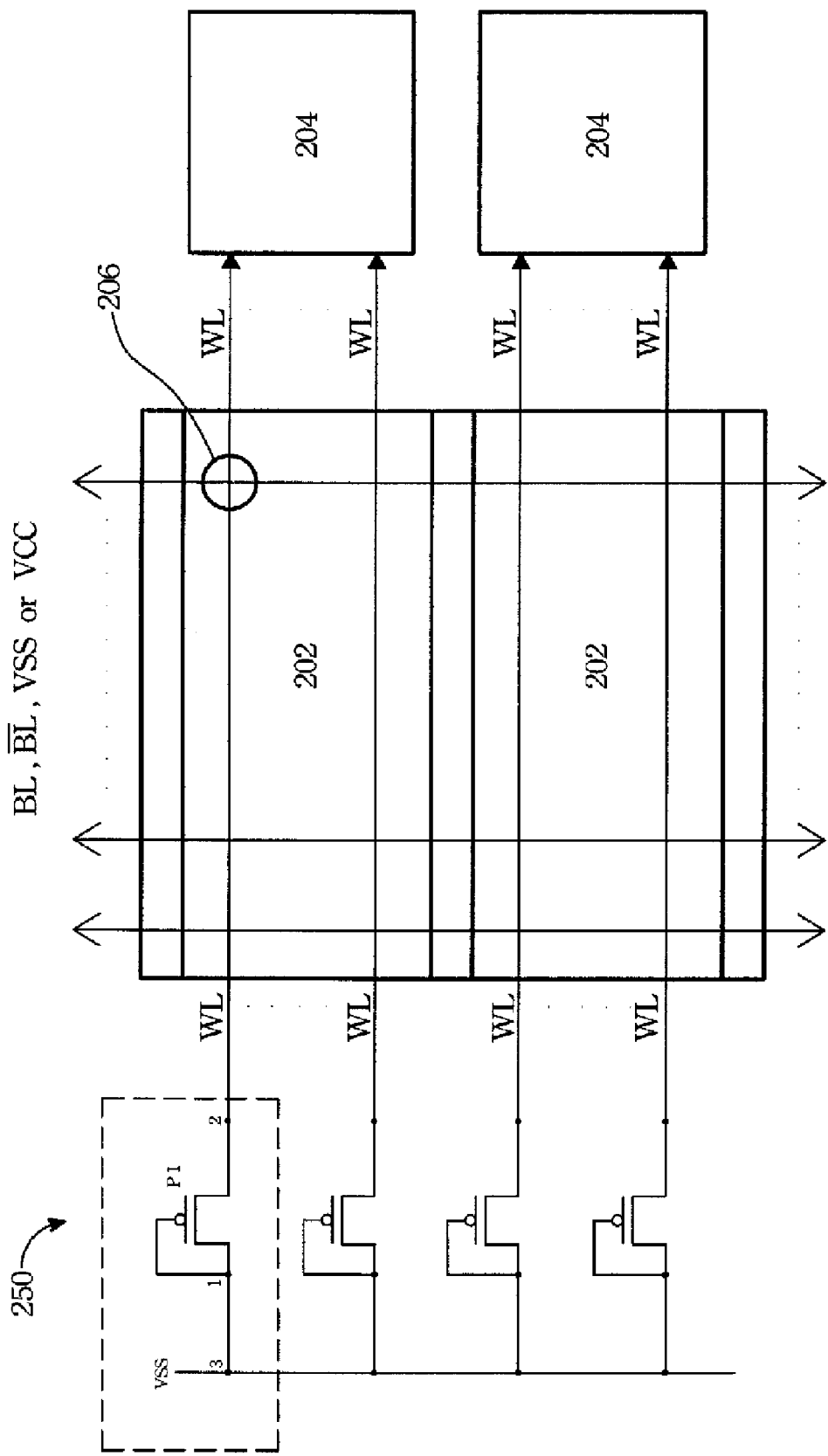
FIG. 7 schematically illustrates the voltage control circuit in accordance with the fifth embodiment of the present invention.

FIG. 7 schematically illustrates a DC voltage control circuit 250 in accordance with the fifth embodiment of the present invention. The DC voltage control circuit 250 includes at least one PMOS transistor P1 having a drain coupled to the word line WL and both a gate and a source coupled to either ground or VSS. The N-well of the PMOS transistor P1 is coupled to VDD.

Figure 8:
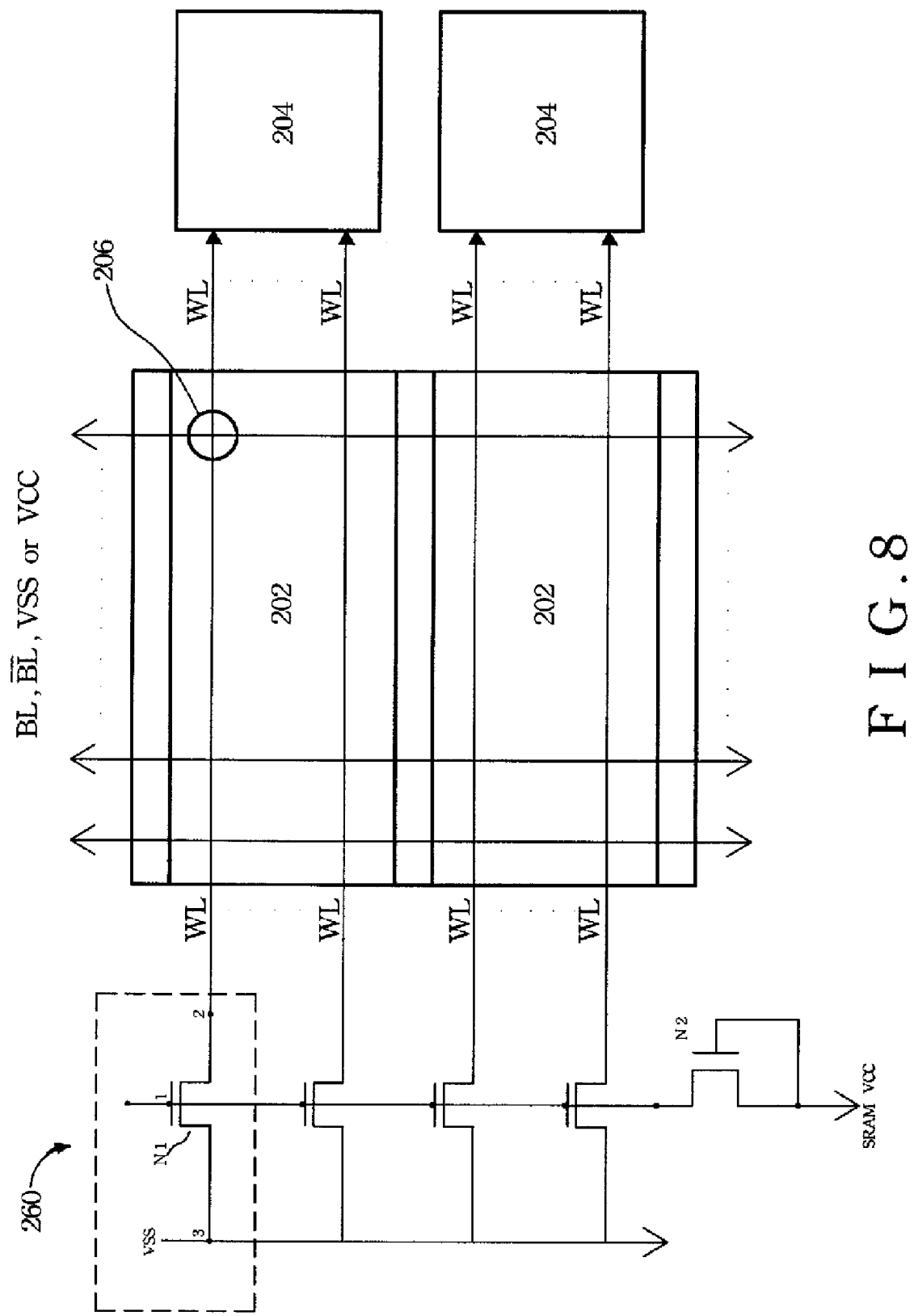
FIG. 8 schematically illustrates the voltage control circuit in accordance with the sixth embodiment of the present invention.

FIG. 8 schematically illustrates a DC voltage control circuit 260 in accordance with the sixth embodiment of the present invention. The DC voltage control circuit 260 includes at least two NMOS transistors N1, N2. The drain of the NMOS transistor N1 is coupled to the WL, the gate of the NMOS transistor N1 is coupled to the source of the NMOS transistor N2 that provides a predetermined constant DC voltage, and the source of the NMOS transistor N1 is coupled to either ground or VSS. Both the drain and gate of the NMOS transistor N2 are connected to the SRAM power line VCC.

Figure 9:
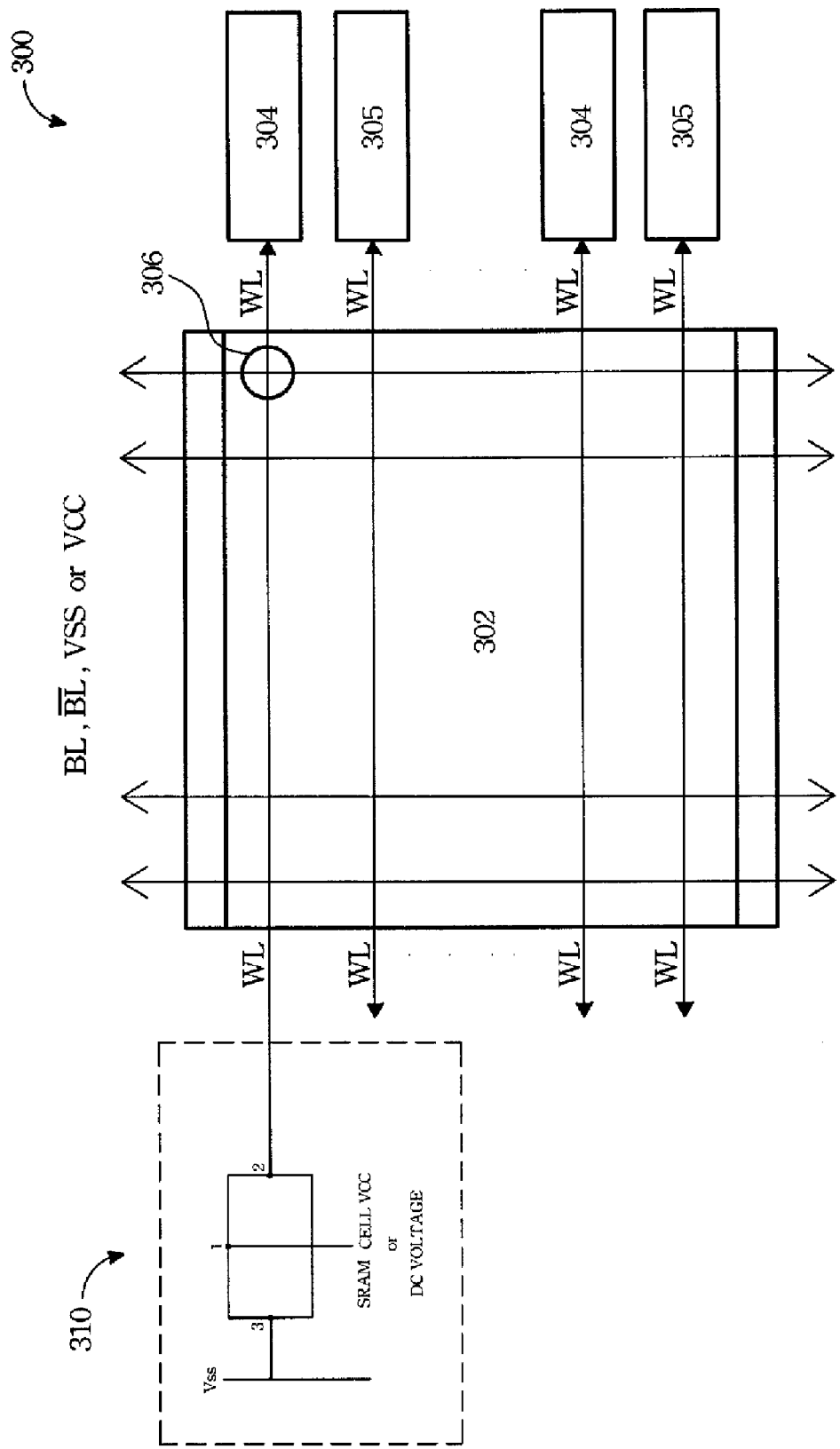
FIG. 9 schematically illustrates a block diagram of a voltage control circuit controlling word lines of a two-port SRAM array in accordance with one embodiment of the present invention.

FIG. 9 schematically illustrates a block diagram 300 of a DC voltage control circuit 310 controlling word lines of a two-port SRAM array 302 in accordance with one embodiment of the present invention. The SRAM array 302 has a plurality of memory cells 306 at intersections of word lines WL and bit lines BL. Each memory cell 306 is also connected to a power supply line denoted by VCC and a ground line denoted by VSS. The word lines WL control the pass gate devices in each memory cell 306. The two-port SRAM array 302 has two word line decoders 304, 305. Each word line WL has two terminals, one is coupled to the word line decoder 304 or 305 and is coupled to the DC voltage control circuit 310. The DC voltage control circuit 310 can be any of the previously described embodiments. In each embodiments, the first terminal of the voltage control circuit 310 is coupled to a DC voltage source or the SRAM supply power line VCC, the second terminal is coupled to the word line WL, and third terminal is coupled to ground or VSS.

Figure 10:
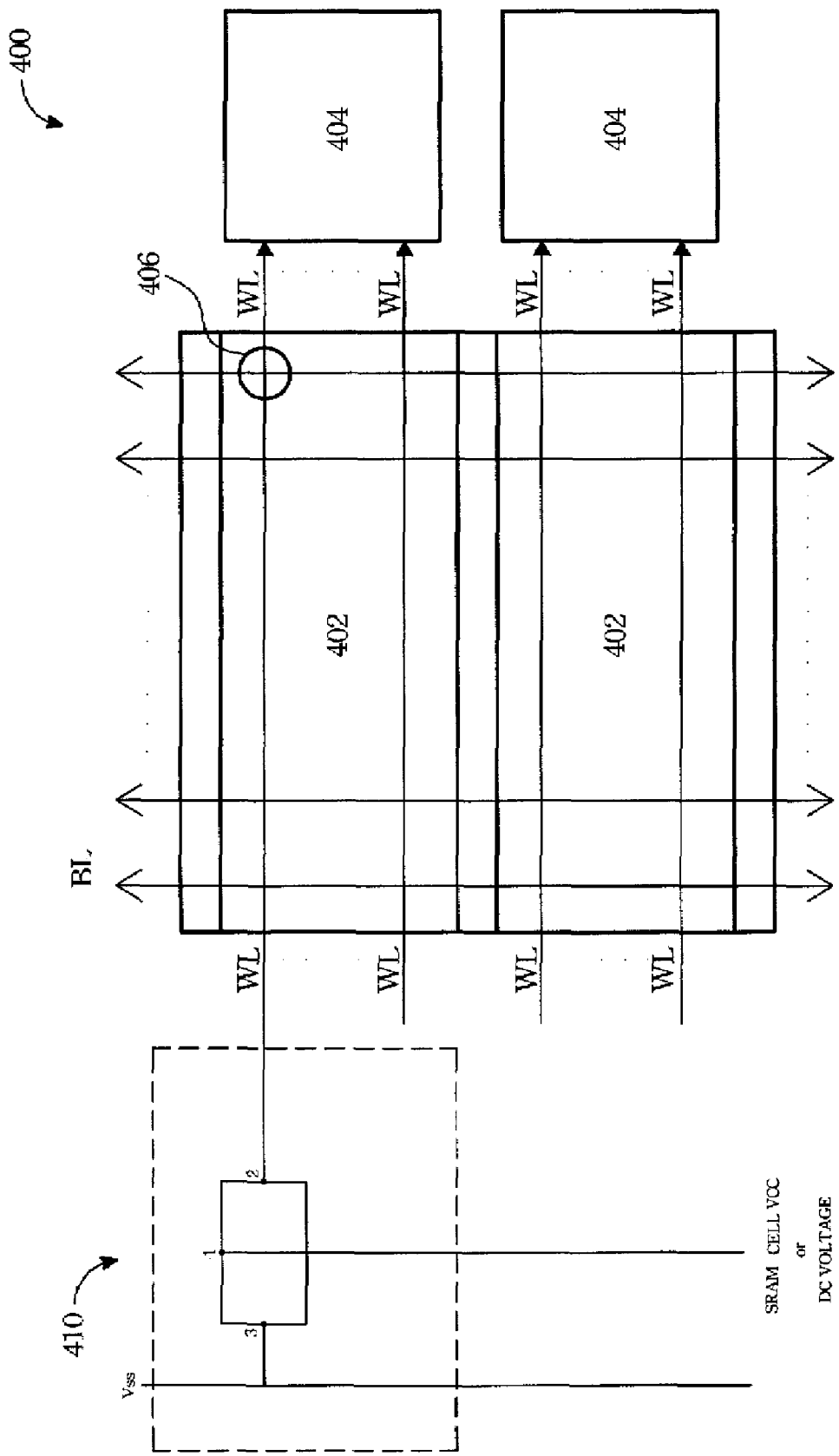
FIG. 10 schematically illustrates a block diagram of a voltage control circuit controlling word lines of a DRAM array in accordance with another embodiment of the present invention.

FIG. 10 schematically illustrates a block diagram 400 of a DC voltage control circuit 410 for controlling word lines of a DRAM array 402 in accordance with another embodiment of the present invention. The DRAM memory array 402 has a plurality memory cells 406 at intersections of word lines WL and bit lines BL. Each memory cell 406 includes a corresponding bit line BL and word line WL. The word line WL has two terminals, one is coupled to the word line decoder 404 and the other is coupled to the DC voltage control circuit 410. The DC voltage control circuit 410 can be any of the previously described embodiments. In each embodiment, the first terminal of the voltage control circuit is connected to either a DC voltage source or the SRAM supply power line VCC, the second terminal is connected to the word line WL, and the third terminal is connected to ground or VSS.

The above illustration provides many different embodiments or embodiments for implementing different features of the invention. Specific embodiments of components and processes are described to help clarify the invention. These are, of course, merely embodiments and are not intended to limit the spirit and scope of the present invention.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device comprising:
    at least one memory array having a plurality of memory cells addressed by a plurality of word lines and bit lines, and coupled between a power line and a ground line;
    a word line decoder coupled to one end of the word line for selecting the word lines in response to input signals; and
    a voltage control circuit coupled to another end of the word line for connecting the word line to a ground voltage when the memory device is in a sleep mode, wherein the voltage control circuit is supplied by DC (direct current) power,
    wherein the voltage control circuit comprises an NMOS transistor and a PMOS transistor, the NMOS transistor having a source coupled to ground, a drain coupled to the word line, and a gate coupled to a drain of the PMOS transistor, which has a gate coupled to the drain of the NMOS transistor, and a source coupled to a predetermined DC voltage.

2. The memory device of claim 1 wherein the voltage control circuit comprises a first terminal connected to the word lines, a second terminal connected to ground, and a third terminal connected to a predetermined DC voltage.

3. The memory device of claim 1 wherein the voltage control circuit is controlled by voltages on the word lines.

4. The memory device of claim 1 wherein the voltage control circuit comprises a first NMOS transistor, a second NMOS transistor and a PMOS transistor, the first NMOS transistor having a source coupled to ground, a drain coupled to the word line, and a gate coupled to drains of the second NMOS transistor and the PMOS transistor, the second NMOS transistor having a source coupled to ground and a gate coupled to the word line, the PMOS transistor having a gate coupled to the word line and a source coupled to a predetermined DC voltage.

5. The memory device of claim 1 wherein the voltage control circuit comprises a PMOS transistor having a gate coupled to a predetermined DC voltage, a source coupled to the word line, a drain coupled to ground, and an N-well coupled to a sleep mode voltage.

6. The memory device of claim 1 wherein the voltage control circuit comprises a PMOS transistor having a gate and a source coupled to the word line, a drain coupled to ground, and an N-well coupled to a sleep mode voltage.

7. The memory device of claim 1 wherein the voltage control circuit comprises a PMOS transistor having a source coupled to the word line, a gate and a drain coupled to ground, and an N-well coupled to a sleep mode voltage.

8. The memory device of claim 1 wherein the voltage control circuit comprises a first NMOS transistor and a second NMOS transistor, the first NMOS transistor having a drain coupled to the word line, and a source coupled to ground, the second NMOS transistor having a source coupled to a gate of the first NMOS transistor and a drain and a gate coupled to the a predetermined DC voltage.

9. The memory device of claim 1 wherein the memory cell is a six-transistor static random access memory (SRAM) cell, eight-transistor SRAM cell or dynamic random access memory (DRAM) cell.

10. A memory device comprising:
    at least one memory array having a plurality of memory cells addressed by a plurality of word lines and bit lines, and coupled between a power line and a ground line;
    a word line decoder coupled to one end of the word line for selecting the word line in response to input signals; and
    a voltage control circuit having a first terminal connected to the word line, a second terminal connected to ground, and a third terminal connected to a predetermined DC voltage, for connecting the word line to ground during a sleep mode,
    wherein the voltage control circuit comprises an NMOS transistor and a PMOS transistor, the NMOS transistor having a source coupled to ground, a drain coupled to the word line, and a gate coupled to a drain of the PMOS transistor, which has a gate coupled to the drain of the NMOS transistor, and a source coupled to a predetermined DC voltage.

11. The memory device of claim 10 wherein the voltage control circuit comprises a first NMOS transistor, a second NMOS transistor and a PMOS transistor, the first NMOS transistor having a source coupled to ground, a drain coupled to the word line, and a gate coupled to drains of the second NMOS transistor and the PMOS transistor, the second NMOS transistor having a source coupled to ground and a gate coupled to the word line, the PMOS transistor having a gate coupled to the word line and a source coupled to a predetermined DC voltage.

12. The memory device of claim 10 wherein the voltage control circuit comprises a PMOS transistor having a gate coupled to a predetermined DC voltage, a source coupled to the word line, a drain coupled to ground, and an N-well coupled to a sleep mode voltage.

13. The memory device of claim 10 wherein the voltage control circuit comprises a PMOS transistor having a gate and a source coupled to the word line, a drain coupled to ground, and an N-well coupled to a sleep mode voltage.

14. The memory device of claim 10 wherein the voltage control circuit comprises a PMOS transistor having a source coupled to the word line, a gate and a drain coupled to ground, and an N-well coupled to a sleep mode voltage.

15. The memory device of claim 10 wherein the voltage control circuit comprises a first NMOS transistor and a second NMOS transistor, the first NMOS transistor having a drain coupled to the word line, and a source coupled to ground, the second NMOS transistor having a source coupled to a gate of the first NMOS transistor and a drain and a gate coupled to the a predetermined DC voltage.

16. The memory device of claim 15 wherein the memory cell is a six-transistor static random access memory (SRAM) cell, eight-transistor SRAM cell or dynamic random access memory (DRAM) cell.

17. The memory device of claim 15 wherein the voltage control circuit is controlled by voltages on the word lines.

* * * * *